(12) United States Patent
Okazawa et al.

(10) Patent No.: US 11,217,428 B2
(45) Date of Patent: Jan. 4, 2022

(54) MULTI CHARGED PARTICLE BEAM WRITING APPARATUS

(71) Applicant: NuFlare Technology, Inc., Yokohama (JP)

(72) Inventors: Mitsuhiro Okazawa, Yokohama (JP); Hirofumi Morita, Setagaya-ku (JP)

(73) Assignee: NuFlare Technology, Inc., Yokohama (JP)

( * ) Notice: Subject to any disclaimer, the term of this patent is extended or adjusted under 35 U.S.C. 154(b) by 114 days.

(21) Appl. No.: 16/835,369

(22) Filed: Mar. 31, 2020

(65) Prior Publication Data
US 2020/0343073 A1 Oct. 29, 2020

(30) Foreign Application Priority Data
Apr. 25, 2019 (JP) .............................. JP2019-084353

(51) Int. Cl.
*H01J 37/317* (2006.01)
*H01J 37/09* (2006.01)
(Continued)

(52) U.S. Cl.
CPC ........ *H01J 37/3177* (2013.01); *H01J 37/045* (2013.01); *H01J 37/09* (2013.01);
(Continued)

(58) Field of Classification Search
CPC ...... H01J 37/3177; H01J 37/045; H01J 37/09; H01J 2237/0435; H01J 2237/0453
See application file for complete search history.

(56) References Cited

U.S. PATENT DOCUMENTS

| 4,450,578 A * | 5/1984 | Hill ........................... G21F 5/04 |
| | | 378/150 |
| 6,344,655 B1* | 2/2002 | Sakazaki ............. H01J 37/3174 |
| | | 250/492.2 |

(Continued)

FOREIGN PATENT DOCUMENTS

| JP | 2006-140267 A | 6/2006 |
| JP | 2013-128031 A | 6/2013 |
| JP | 2019-79953 A | 5/2019 |

OTHER PUBLICATIONS

Combined Taiwanese Office Action and Search Report dated Jan. 8, 2021 in Taiwanese Patent Application No. 109109706 (with unedited computer generated English translation), 8 pages.

*Primary Examiner* — Sean M Luck
(74) *Attorney, Agent, or Firm* — Oblon, McClelland, Maier & Neustadt, L.L.P.

(57) ABSTRACT

Provided is a multi charged particle beam writing apparatus including: an emission unit emitting a charged particle beam; a restriction aperture unit having a first opening having a variable opening area, the restriction aperture unit shielding a portion of the charged particle beam; a shaping aperture array substrate having a plurality of second openings, the shaping aperture array substrate forming multiple beams by allowing the shaping aperture array substrate to be irradiated with the charged particle beam passing through the first opening and allowing a portion of the charged particle beam to pass through the plurality of second openings; and a blanking aperture array substrate having a plurality of third openings, each beam of the multiple beams passing through the plurality of third openings, the blanking aperture array substrate being capable of independently deflecting each beam of the multiple beams.

12 Claims, 11 Drawing Sheets

(51) Int. Cl.
*H01J 37/12* (2006.01)
*H01J 37/04* (2006.01)

(52) U.S. Cl.
CPC ....... *H01J 37/12* (2013.01); *H01J 2237/0435* (2013.01); *H01J 2237/0453* (2013.01)

(56) References Cited

U.S. PATENT DOCUMENTS

| | | | | |
|---|---|---|---|---|
| 6,462,807 | B1 * | 10/2002 | Nishi | G03F 7/70066 250/491.1 |
| 8,546,767 | B2 | 10/2013 | Platzgummer et al. | |
| 8,664,594 | B1 * | 3/2014 | Jiang | H01J 37/28 250/306 |
| 2003/0132382 | A1 * | 7/2003 | Sogard | H01J 37/261 250/311 |
| 2005/0072941 | A1 * | 4/2005 | Tanimoto | H01J 37/317 250/492.22 |
| 2006/0289781 | A1 * | 12/2006 | Tanimoto | H01J 37/3174 250/396 R |
| 2007/0257207 | A1 * | 11/2007 | Frosien | H01J 37/09 250/492.3 |
| 2008/0217554 | A1 * | 9/2008 | Abe | B82Y 10/00 250/398 |
| 2009/0074148 | A1 * | 3/2009 | Echner | G21K 1/04 378/152 |
| 2012/0181444 | A1 * | 7/2012 | Tahmassebpur | H01J 37/28 250/396 R |
| 2015/0311032 | A1 * | 10/2015 | Jung | H01J 37/3174 250/396 R |
| 2019/0122856 | A1 | 4/2019 | Morita | |
| 2020/0273668 | A1 * | 8/2020 | Matsumoto | H01J 37/3177 |

\* cited by examiner

MULTI CHARGED PARTICLE BEAM WRITING APPARATUS

CROSS-REFERENCE TO RELATED APPLICATION

This application is based upon and claims the benefit of priority from Japanese Patent Applications No. 2019-084353, filed on Apr. 25, 2019, the entire contents of which are incorporated herein by reference.

FIELD OF THE INVENTION

Embodiments relate to a multi charged particle beam writing apparatus.

BACKGROUND OF THE INVENTION

With high integration of semiconductor devices, circuit patterns of semiconductor devices have become fine. In realizing a fine circuit pattern, a lithography technique for forming a circuit pattern on a semiconductor substrate becomes important. In order to form a fine circuit pattern by using a lithography technique, an original image pattern (also referred to as a reticle or a mask) with high accuracy is required. Electron beam writing inherently has excellent resolution, and thus, is used for manufacturing an original image pattern with high accuracy.

For example, there is a writing apparatus using multiple beams. Compared to pattern drawing with one electron beam, a target object can be irradiated with many electron beams at once by using the multiple beams. Therefore, it is possible to greatly improve the throughput of the pattern drawing.

In a writing apparatus using multiple beams, the multiple beams are formed by allowing an electron beam emitted from an electron gun assembly to pass through a shaping aperture array having a plurality of openings. Each beam of the multiple beams is independently deflected by a blanking aperture array substrate.

The blanking aperture array substrate has a plurality of openings through which each beam of the multiple beams passes and an electrode pair provided in each of the openings. By controlling the voltage applied to the electrode pair, each beam of the multiple beams is deflected. The beam deflected by the electrode pair is shielded, and the target object is irradiated with the beam that is not deflected, so that the pattern drawing is performed.

The temperature of the shaping aperture array substrate rises due to the irradiation with the electron beam. If the temperature of the shaping aperture array substrate rises, the pitch of the openings changes due to thermal expansion. If the pitch of the openings deviates from a predetermined range, for example, each beam of the multiple beams cannot pass through the desired openings of the blanking aperture array, and thus, there is a problem that the electron beam with which the target object is irradiated is lost.

For this reason, for example, the pitch of the openings of the shaping aperture array is designed in consideration of a change due to a rise in temperature of the shaping aperture array substrate in advance. During the time of pattern drawing, the temperature of the shaping aperture array substrate is maintained in a predetermined range, so that the pitch of the openings falls within a predetermined range.

In order to prevent the temperature of the shaping aperture array substrate from rising, for example, it is considered that a restriction aperture that restricts the amount of the electron beam with which the shaping aperture array substrate is irradiated is provided. The restriction aperture is provided between the electron gun assembly and the shaping aperture array substrate and shields a portion of the electron beam to restrict the amount of the electron beam with which the shaping aperture array substrate is irradiated.

On the other hand, if the shaping aperture temperature is suppressed to be too low, there is a problem in that the growth of dirt (mainly hydrocarbon) in the holes of the shaping aperture is facilitated. If dirt grows in the holes of the shaping aperture, there occur problems in pattern drawing accuracy such as a deterioration in beam shape accuracy and a deterioration in beam position accuracy. For this reason, it is necessary to replace the shaping aperture, but since it is necessary to stop the apparatus and perform the replacement operation, there is a problem in that the operating rate of the apparatus significantly decreases. Thus, in order to suppress a change in pitch of the shaping aperture openings due to a temperature rise, it is better to lower the temperature, but if the temperature is too low, there occur problems such as a deterioration in accuracy due to the growth of dirt on the shaping aperture and a decrease in operating rate.

SUMMARY OF THE INVENTION

A multi charged particle beam writing apparatus according to one embodiment includes: an emission unit emitting a charged particle beam; a restriction aperture unit having a first opening having a variable opening area, the restriction aperture unit shielding a portion of the charged particle beam; a shaping aperture array substrate having a plurality of second openings, the shaping aperture array substrate forming multiple beams by allowing the shaping aperture array substrate to be irradiated with the charged particle beam passing through the first opening and allowing a portion of the charged particle beam to pass through the plurality of second openings; and a blanking aperture array substrate having a plurality of third openings, each beam of the multiple beams passing through the plurality of third openings, the blanking aperture array substrate being capable of independently deflecting each beam of the multiple beams.

DETAILED DESCRIPTION OF THE EMBODIMENTS

Hereinafter, embodiments will be described with reference to the drawings. Hereinafter, in the embodiments, a configuration using an electron beam will be described as an example of a charged particle beam. However, the charged particle beam is not limited to an electron beam, but a beam using charged particles such as an ion beam may be used.

In this specification, the pattern drawing data is basic data of the pattern to be drawn on the target object. The pattern drawing data is data obtained by converting a format of design data generated by a designer by CAD or the like so that arithmetic processing can be performed in the writing apparatus. A drawing pattern of a figure or the like is defined by, for example, coordinates such as vertices of the figure.

First Embodiment

A multi charged particle beam writing apparatus according to a first embodiment includes: an emission unit emitting a charged particle beam; a restriction aperture unit having a first opening having a variable opening area, the restriction aperture unit shielding a portion of the charged particle beam; a shaping aperture array substrate having a plurality of second openings, the shaping aperture array substrate forming multiple beams by allowing the shaping aperture array substrate to be irradiated with the charged particle beam passing through the first opening and allowing a portion of the charged particle beam to pass through the plurality of second openings; and a blanking aperture array substrate having a plurality of third openings, each beam of the multiple beams passing through the plurality of third openings, the blanking aperture array substrate being capable of independently deflecting each beam of the multiple beams.

Hereinafter, a case where the multi charged particle beam writing apparatus is a mask writing apparatus will be described as an example.

Figure 1:
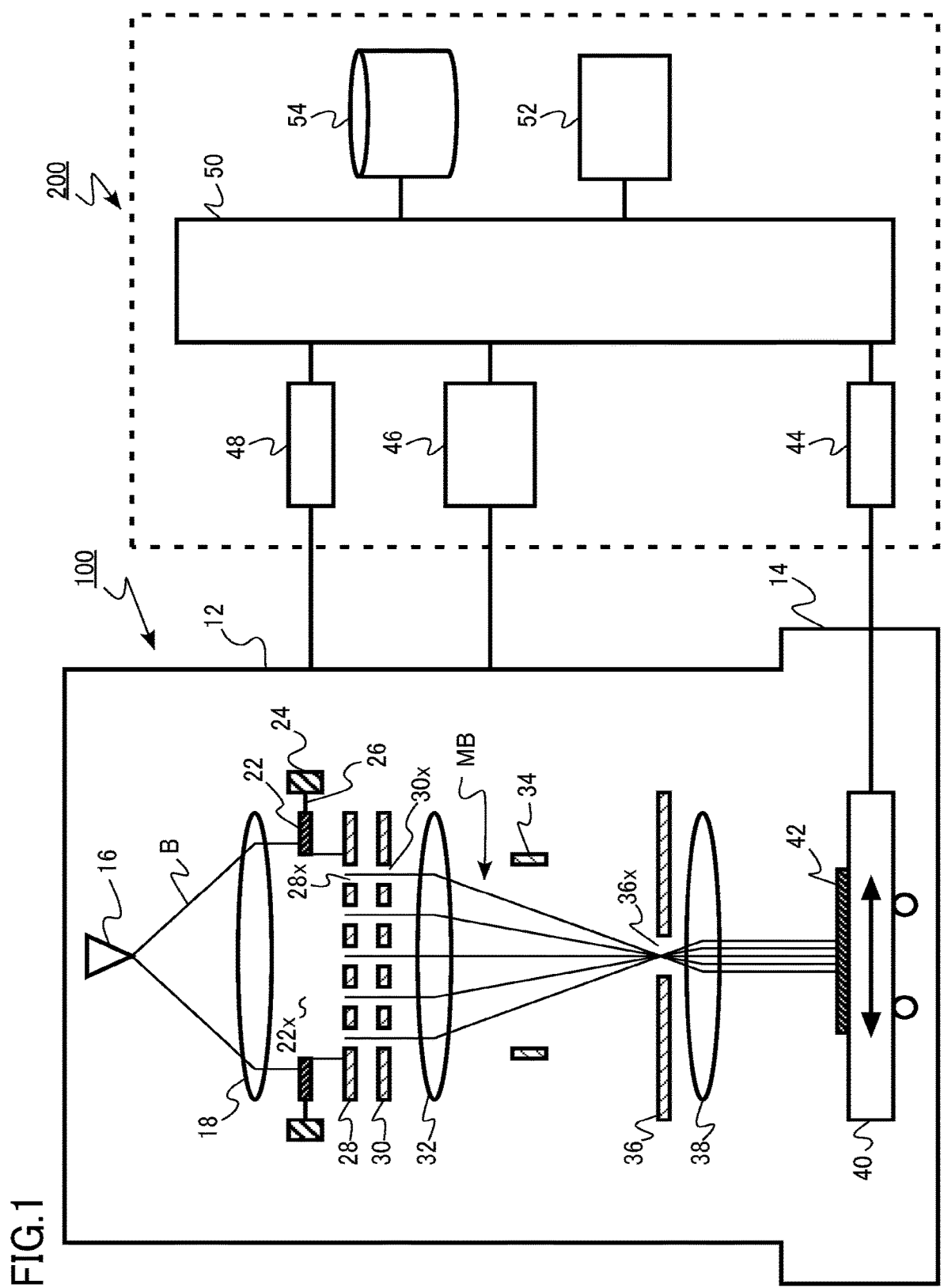
FIG. 1 is a conceptual view illustrating a configuration of a multi charged particle beam writing apparatus according to a first embodiment.

FIG. 1 is a conceptual view illustrating a configuration of the multi charged particle beam writing apparatus according to the first embodiment.

As illustrated in FIG. 1, a mask writing apparatus (charged particle beam writing apparatus) includes a pattern drawing unit 100 and a control unit 200. The mask writing apparatus draws a desired pattern on a target object 42.

The pattern drawing unit 100 has an electron lens barrel 12 and a pattern drawing chamber 14. An electron gun assembly 16 (emission unit), an illumination lens 18, a restriction aperture unit 22, a shaping aperture array substrate 28, a blanking aperture array substrate 30, a projection lens 32, a deflector 34, a stopping aperture substrate 36 and an objective lens 38 are arranged in the electron lens barrel 12. The pattern drawing unit 100 performs pattern drawing on the target object 42.

An XY stage 40 movably arranged is arranged in the pattern drawing chamber 14. The target object 42 can be mounted on the XY stage 40. The target object 42 is a mask substrate for exposure for transferring a pattern to a wafer. The mask substrate is, for example, a mask blank on which nothing is drawn yet.

The inside of the electron lens barrel 12 and the inside of the pattern drawing chamber 14 are evacuated by a vacuum pump (not illustrated) to be substantially vacuum.

The control unit 200 includes a stage driving circuit 44, a deflection control circuit 46, a restriction aperture driving circuit 48, a control calculator 50, a memory 52, and a magnetic disk drive 54. The control unit 200 controls the pattern drawing unit 100 that performs pattern drawing on the target object 42.

The electron gun assembly 16 emits an electron beam B. The electron gun assembly 16 is an example of an emission unit.

The illumination lens 18 is provided on the XY stage 40 side (hereinafter, referred to as a downstream side) of the electron gun assembly 16. The illumination lens 18 refracts the electron beam B emitted from the electron gun assembly 16 and irradiates the restriction aperture unit 22 with the electron beam B. At this time, the illumination angle can be set to a predetermined angle by the illumination lens 18. In the present embodiment, the light is emitted vertically, but a reduction optical system described later may be used. Herein, the illumination lens 18 is an electron lens.

The restriction aperture unit 22 is provided on the downstream side of the illumination lens 18. The restriction aperture unit 22 is provided between the illumination lens 18 and the shaping aperture array substrate 28. The restriction aperture unit 22 shields a portion of the electron beam B with which the restriction aperture unit 22 is irradiated through the illumination lens 18.

Figure 2A:
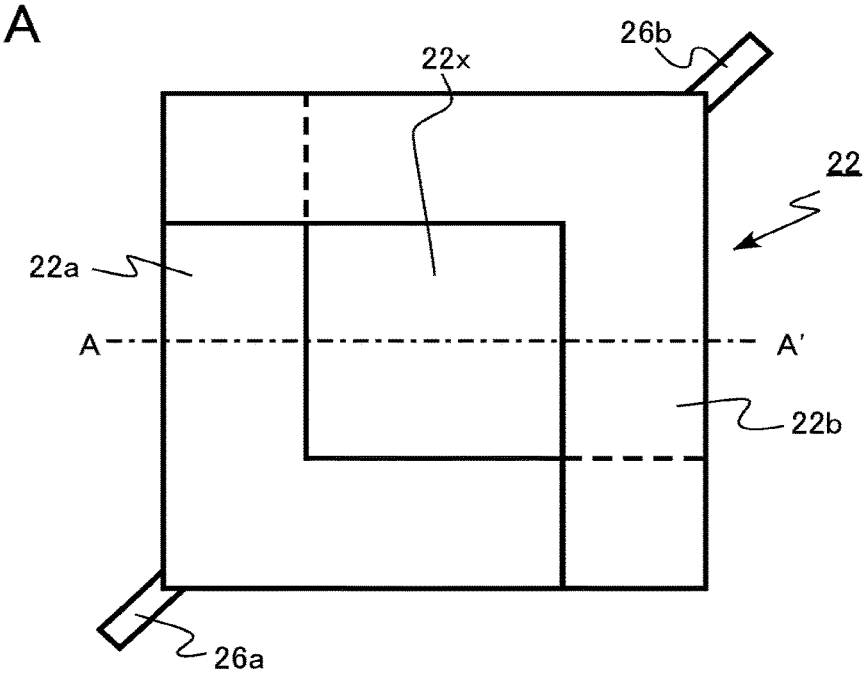
FIGS. 2A, 2B, 2C, and 2D are schematic views of a restriction aperture unit according to the first embodiment.
Figure 2B:
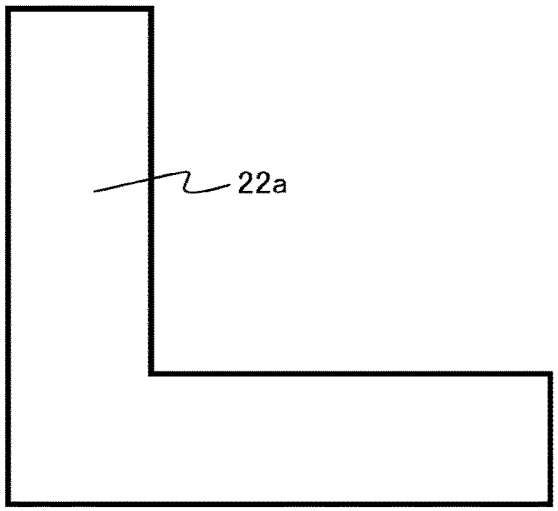
Figure 2C:
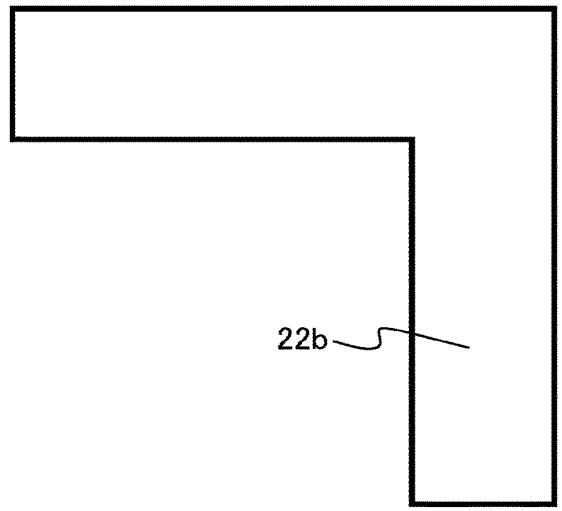
Figure 2D:

FIGS. 2A, 2B, 2C, and 2D are schematic views of the restriction aperture unit according to the first embodiment. FIG. 2A is a top view of the restriction aperture unit, FIG. 2B is a top view of a portion (first portion) of the restriction aperture unit, FIG. 2C is a top view of another portion (second portion) of the restriction aperture unit, and FIG. 2D is a cross-sectional view of the restriction aperture unit. FIG. 2D illustrates an AA' cross-section of FIG. 2A.

As illustrated in FIG. 2A, the restriction aperture unit 22 has a first opening 22x. The first opening 22x has, for example, a rectangular shape. The first opening 22x has, for example, a square shape. A portion of the electron beam B with which the restriction aperture unit 22 is irradiated passes through the first opening 22x.

The restriction aperture unit 22 is configured by combining two L-shaped components (a first portion 22a and a second portion 22b). Each of the first portion 22a and the second portion 22b has a plate shape.

As illustrated in FIGS. 2A and 2D, at least a portion of the second portion 22b faces the first portion 22a. At least a portion of the second portion 22b overlaps the first portion 22a in the up-down direction. The first opening 22x is formed by the second portion 22b overlapping the first portion 22a.

The first portion 22a is separated from the second portion 22b, for example, with a predetermined gap in the up-down direction (vertical direction) without contact.

The restriction aperture unit 22 contains, for example, heavy metal. The first portion 22a and the second portion 22b constituting the restriction aperture unit 22 are configured with, for example, a material containing a heavy metal that is non-magnetic and does not generate X-rays. The heavy metal is, for example, tantalum (Ta), tungsten (W), or gold (Au). In addition, the heavy metal denotes a metal having a specific gravity equal to or higher than that of iron (Fe).

In addition, as a material of the restriction aperture unit 22, for example, carbon (C) or silicon (Si) can be used. In addition, a light metal such as aluminum (l) or titanium (Ti), which has a low reflectance (back scattering coefficient) add is easy to process can also be used.

The thickness of the first portion 22a and the second portion 22b is, for example, 0.3 mm or more and 3 mm or less.

The support portion 26 supports the restriction aperture unit 22. The support portion 26 has a first support bar 26a and a second support bar 26b. In the support portion 26, for example, the first portion 22a is supported by the first support bar 26a. For example, the second portion 22b is supported by the second support bar 26b.

The first portion 22a and the second portion 22b are supported by the first support bar 26a and the second support bar 26b at least one location. The first portion 22a and the second portion 22b may be supported by the support portion 26 at a plurality of locations.

The driving motor 24 is connected to the support portion 26. The driving motor 24 relatively moves the first portion 22a and the second portion 22b by, for example, moving the support portion 26 in the horizontal direction.

The driving motor 24 is, for example, a non-magnetic motor. The driving motor 24 is, for example, a piezo motor. By using a non-magnetic motor as the driving motor 24, the influence of the operation of the driving motor 24 on the trajectory of the electron beam B is reduced.

Figure 3A:
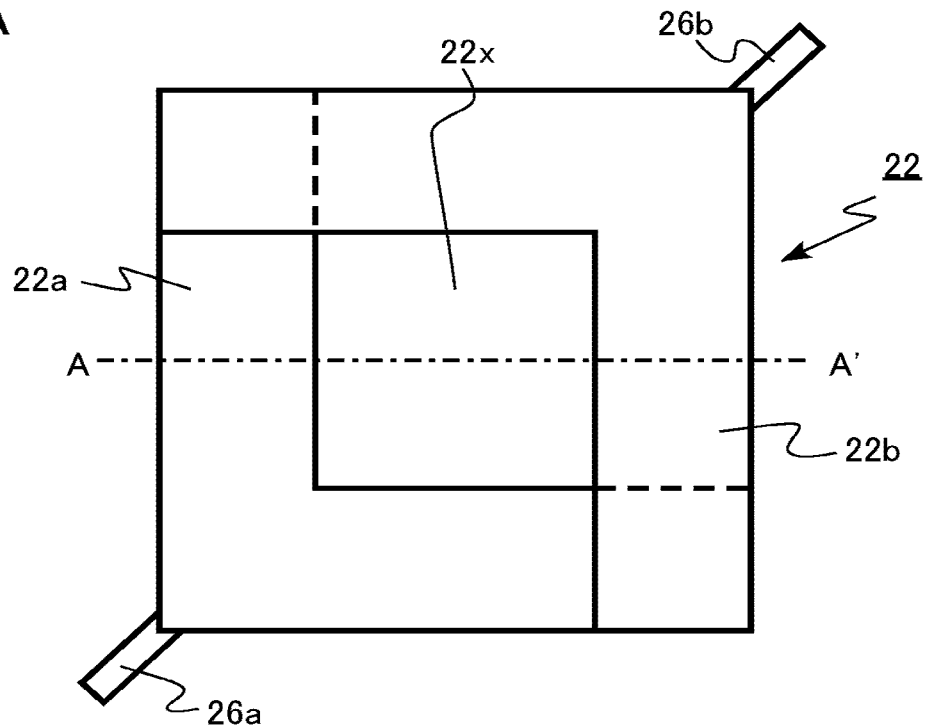
FIGS. 3A and 3B are explanatory views of the restriction aperture unit according to the first embodiment.
Figure 3B:
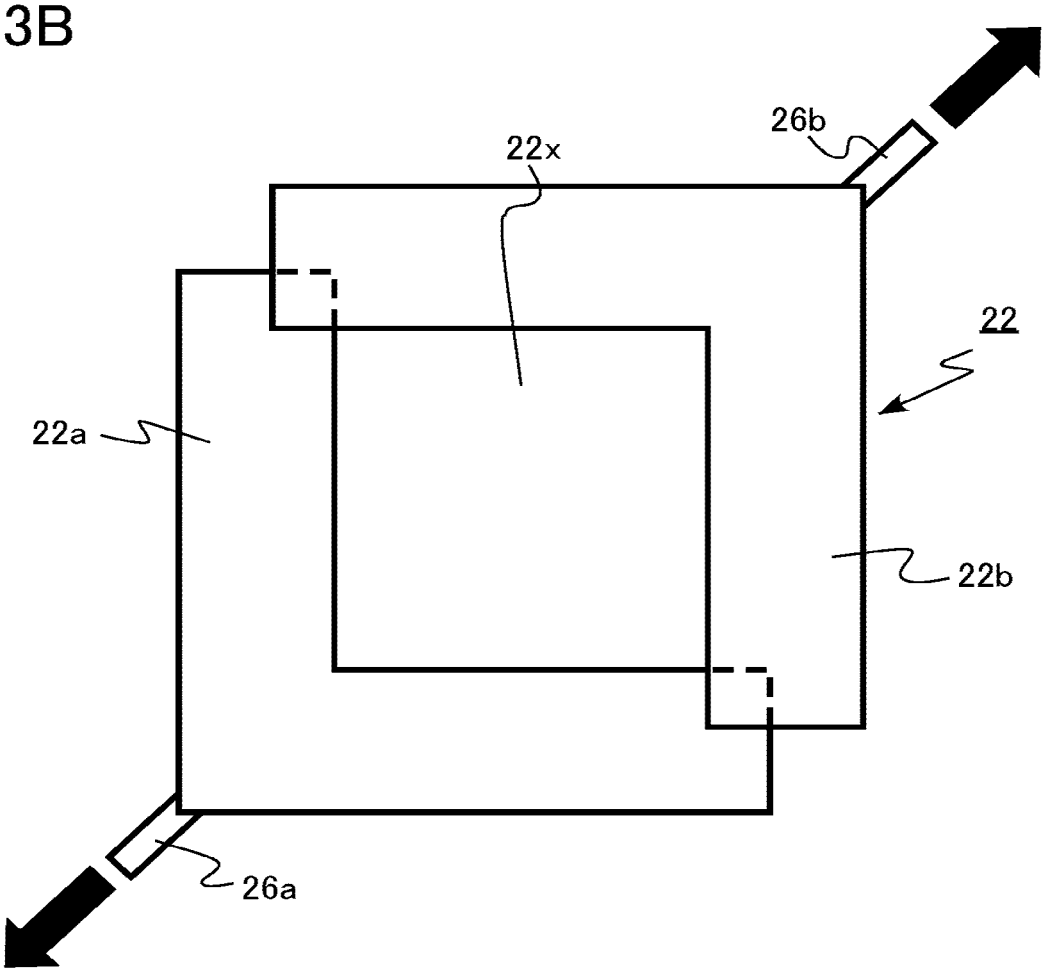

FIGS. 3A and 3B are explanatory views of the restriction aperture unit according to the first embodiment. FIG. 3A illustrates a state where the opening area of the first opening 22x is small, and FIG. 3B illustrates a state where the opening area of the first opening 22x is large.

The opening area of the first opening 22x of the restriction aperture unit 22 is variable. For example, by horizontally move the support portion 26 in the direction of the arrow by driving the driving motor 24, the opening area can be changed from the state where the opening area illustrated in FIG. 3A is small to the state where the opening area illustrated in FIG. 3B is large. In addition, by horizontally moving the support portion 26 in the direction opposite to the direction of the arrow by driving the driving motor 24, the opening area can be changed from the state where the opening area illustrated in FIG. 3B is large to the state where the opening area illustrated in FIG. 3A is small.

The maximum opening area of the first opening 22x is, for example, 1.2 times or more and 3 times or less of the minimum opening area.

The shaping aperture array substrate 28 is provided on the downstream side of the restriction aperture unit 22. The shaping aperture array substrate 28 is provided between the restriction aperture unit 22 and the blanking aperture array substrate 30. The shaping aperture array substrate 28 is irradiated with the electron beam B that has passed through the restriction aperture unit 22. The shaping aperture array substrate 28 forms the multiple beams MB.

Figure 4:
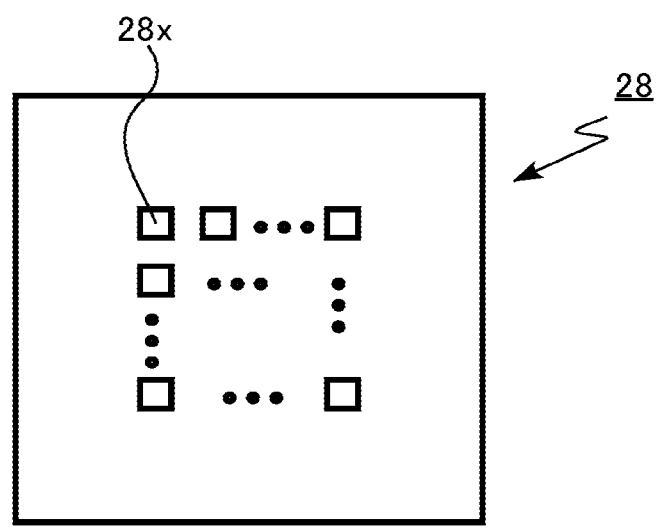
FIG. 4 is a schematic view of a shaping aperture array substrate according to the first embodiment.

FIG. 4 is a schematic view of the shaping aperture array substrate according to the first embodiment. FIG. 4 is a top view of the shaping aperture array substrate.

The shaping aperture array substrate 28 has a plate shape. The shaping aperture array substrate 28 has a plurality of second openings 28x. In the shaping aperture array substrate 28, for example, m rows×n rows (m, n≥2) of second openings 28x are arranged at a predetermined pitch.

The second opening 28x has, for example, a rectangular shape. The second opening 28x has, for example, a square shape. The second opening 28x may have, for example, a circular shape.

A portion of the electron beam B that has passed through the restriction aperture unit 22 passes through the plurality of second openings 28x of the shaping aperture array substrate 28 to be divided, so that multiple beams MB is formed.

The material of the shaping aperture array substrate 28 is, for example, silicon (Si).

The blanking aperture array substrate 30 is provided on the downstream side of the shaping aperture array substrate 28. Each beam of the multiple beams MB can be independently deflected by the blanking aperture array substrate 30.

The blanking aperture array substrate 30 has a plate shape. The blanking aperture array substrate 30 has a plurality of third openings 30x through which each of the multiple beams MB formed by the shaping aperture array substrate 28 passes. In the blanking aperture array substrate 30, for example, m rows×n rows (m, n≥2) of third openings 30x are arranged at a predetermined pitch.

The number of the second openings 28x of the shaping aperture array substrate 28 and the number of the third openings 30x of the blanking aperture array substrate 30 are equal to each other.

A blanker is provided in each of the third openings 30x. The blanker is formed by a pair of electrodes. For example, one electrode of the blanker is fixed at the ground potential, and a potential different from the ground potential is applied to the other electrode. Each beam of the multiple beams MB passing through the third opening 30x is independently deflected by a voltage applied to the blanker.

The projection lens 32 is provided on the downstream side of the blanking aperture array substrate 30. The projection lens 32 allows the multiple beams MB that has passed through the blanking aperture array substrate 30 to converge. The projection lens 32 is an electron lens.

The deflector 34 is provided on the downstream side of the projection lens 32. The deflector 34 deflects the multiple beams MB converged by the projection lens 32 collectively in the same direction.

The stopping aperture substrate 36 is provided on the downstream side of the deflector 34. The stopping aperture substrate 36 shields the electron beam deflected by the blanker of the blanking aperture array substrate 30 among the multiple beams MB.

The stopping aperture substrate 36 has a plate shape. The stopping aperture substrate 36 has a fourth opening 36x. Among the multiple beams MB, the electron beam not deflected by the blanker of the blanking aperture array substrate 30 passes through the fourth opening 36x.

In addition, the deflector 34 can be provided on the downstream side of the stopping aperture substrate 36.

The objective lens 38 is provided on the downstream side of the stopping aperture substrate 36. The objective lens 38 focuses each beam that has passed through the stopping aperture substrate 36 on the target object 42.

The stage driving circuit 44 controls the movement of the XY stage 40 in the pattern drawing chamber 14. The deflection control circuit 46 controls the deflection of the multiple beams MB by the blanking aperture array substrate 30 and the deflector 34.

The restriction aperture driving circuit 48 controls the relative movement between the first portion 22a and the second portion 22b of the restriction aperture unit 22 by the driving motor 24. The restriction aperture driving circuit 48 controls the relative movement between the first portion 22a and the second portion 22*b* of the restriction aperture unit 22. In other words, the restriction aperture driving circuit 48 controls the opening area of the restriction aperture unit 22.

The magnetic disk drive 54 stores, for example, pattern drawing data. The pattern drawing data is input from the magnetic disk drive 54 to the control calculator 50.

The memory 52 stores, for example, information input to the control calculator 50, information during arithmetic processing, and information after arithmetic processing.

The control calculator 50 is connected to the stage driving circuit 44, the deflection control circuit 46, and the restriction aperture driving circuit 48. A command signal is transmitted from the control calculator 50 to the stage driving circuit 44, the deflection control circuit 46, and the restriction aperture driving circuit 48, and pattern drawing is performed.

FIG. 1 illustrates components necessary for describing the first embodiment. It goes without saying that the mask writing apparatus according to the first embodiment usually includes other components necessary for the mask writing apparatus.

Next, the operations of the multi charged particle beam writing apparatus according to the first embodiment will be described.

The restriction aperture unit 22 is irradiated with the electron beam B emitted from the electron gun assembly 16 by the illumination lens 18. At this time, the illumination angle can be set to a predetermined angle by the illumination lens 18. In the present embodiment, the light is emitted vertically, but a reduction optical system described later may be used. The shaping aperture array substrate 28 is irradiated with the electron beam B that has passed through the first opening 22*x* of the restriction aperture unit 22.

The opening area of the first opening 22*x* of the restriction aperture unit 22 is variable. The driving motor 24 operates in response to a command signal from the restriction aperture driving circuit 48 to relatively move the first portion 22*a* and the second portion 22*b*, so that the opening area of the first opening 22*x* changes.

Figure 5A:
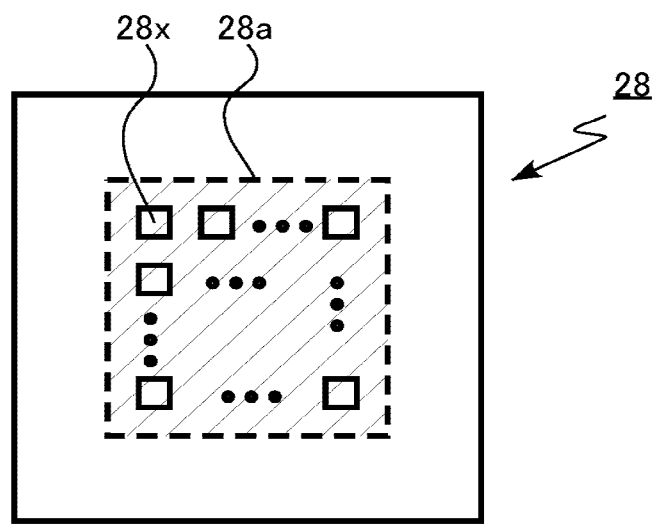
FIGS. 5A and 5B are explanatory views of an illumination region of the shaping aperture array substrate according to the first embodiment.
Figure 5B:
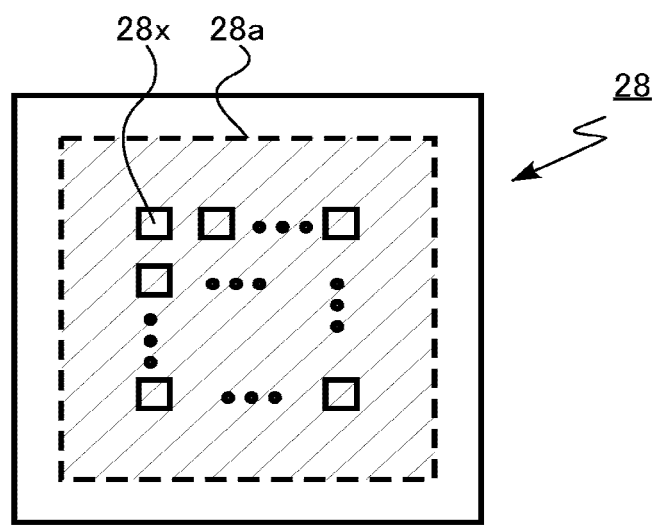

FIGS. 5A and 5B are explanatory views of an illumination region of the shaping aperture array substrate according to the first embodiment. FIG. 5A illustrates a case where the illumination region is narrow, and FIG. 5B illustrates a case where the illumination region is wide. The illumination region is a region irradiated with the electron beam B.

When the opening area of the first opening 22*x* of the restriction aperture unit 22 is small, as illustrated by hatching in FIG. 5A, an illumination region 28*a* of the shaping aperture array substrate 28 becomes narrow. On the other hand, when the opening area of the first opening 22*x* of the restriction aperture unit 22 is large, as illustrated by hatching in FIG. 5B, the illumination region 28*a* of the shaping aperture array substrate 28 becomes wide.

The electron beam B with which the shaping aperture array substrate 28 is irradiated passes through the plurality of second openings 28*x* of the shaping aperture array substrate 28 to be divided, so that a plurality of electron beams (multiple beams MB) are formed.

Each beam of the multiple beams MB passes through a respective opening of a plurality of third openings 30*x* of the blanking aperture array substrate 30. For example, a portion of each beam of the multiple beams MB is deflected by a voltage applied to the blanker.

Each beam of the multiple beams MB that has passed through the plurality of second openings 28*x* of the blanking aperture array substrate 30 is converged by the projection lens 32 and directed to the fourth opening 36*x* of the stopping aperture substrate 36. Among the beams of the multiple beams MB, the electron beam deflected by the blanking aperture array substrate 30 deviates from the fourth opening 36*x* of the stopping aperture substrate 36 and is shielded.

On the other hand, the electron beam not deflected by the blanking aperture array substrate 30 passes through the fourth opening 36*x* of the stopping aperture substrate 36. Irradiation and non-irradiation of each beam to the target object 42 are independently control led by the blanking aperture array substrate 30 and the stopping aperture substrate 36.

A command signal based on the pattern drawing data is transmitted from the control calculator 50 to the deflection control circuit 46. By the command signal from the deflection control circuit 46, the voltage applied to each blanker of the blanking aperture array substrate 30 is controlled, and whether or not each beam is deflected is controlled.

Each beam that has passed through the stopping aperture substrate 36 is focused by the objective lens 38, and the target object 42 is irradiated with each beam, so that the pattern drawing of the target object 42 is performed.

The beams are deflected collectively by the deflector 34, so that a predetermined position of the target object 42 is irradiated with the beams. A command signal based on the pattern drawing data is transmitted from the control calculator 50 to the deflection control circuit 46. The electron beam is deflected by the deflector 34 on the basis of the command signal from the deflection control circuit 46, and a predetermined position on the target object 42 determined by the pattern drawing data is irradiated with the electron beam.

For example, a predetermined position on the target object 42 on the XY stage 40 that continuously moves is irradiated with the electron beam. The XY stage 40 moves on the basis of the command signal from the stage driving circuit 44. The electron beam follows the movement of the XY stage 40 by being deflected by the deflector 34.

Next, the functions and effects of the charged particle beam writing apparatus according to the first embodiment will be described.

The temperature of the shaping aperture array substrate 28 rises by the irradiation with the electron beam B. If the temperature of the shaping aperture array substrate 28 rises, the pitch of the second openings 28*x* changes due to thermal expansion. If the pitch of the second openings 28*x* deviates from a predetermined range, for example, each beam of the multiple beams MB cannot pass through the corresponding third opening 30*x* of the blanking aperture array substrate 30, and thus, there is a problem in that the electron beam with which the target object 42 is to be irradiated is lost.

For this reason, for example, the pitch of the second openings 28*x* of the shaping aperture array substrate 28 is designed in consideration of a change due to a temperature rise in advance. During the time of pattern drawing, by maintaining the temperature of the shaping aperture array substrate 28 in a predetermined range, the pitch of the second openings 28*x* is allowed to fall within the predetermined range. Therefore, if the temperature of the shaping aperture array substrate 28 is too high or too low, the pitch of the second openings 28*x* deviates from a predetermined range, and thus, there is a problem in that the electron beam with which the target object 42 is to be irradiated is lost.

Furthermore, in a case where the temperature of the shaping aperture array substrate 28 is too low, the solidified adhesive substance from the atmosphere adheres to the second opening 28*x*. If an adhesive substance adheres to the second opening 28x, the electron beam is unintentionally deflected due to charge-up, and thus, there is a problem in that the pattern drawing accuracy decreases. In addition, if the amount of the adhesive substance is large, the second opening 28x is closed, and thus, there is a problem in that the beam with which the target object 42 is irradiated is lost.

For example, there is a method of controlling the temperature of the shaping aperture array substrate 28 with cooling water. The temperature of the shaping aperture array substrate 28 is controlled by circulating cooling water for cooling the shaping aperture array substrate 28 and controlling the temperature and the flow rate of the cooling water.

However, in the temperature control based on the temperature and the flow rate of the cooling water, it takes time to change the temperature of the shaping aperture array substrate 28. For this reason, there is a problem in that the throughput of the mask writing apparatus decreases.

In the mask writing apparatus according to the first embodiment, the opening area of the first opening 22x of the restriction aperture unit 22 is variable. For this reason, the area of the illumination region 28a of the electron beam B with which the shaping aperture array substrate 28 is irradiated also becomes variable.

By changing the area of the illumination region 28a, the temperature of the shaping aperture array substrate 28 can be changed. For example, in a case where it is desired to lower the temperature of the shaping aperture array substrate 28, the illumination region 28a is allowed to be narrow as illustrated in FIG. 5A. On the other hand, for example, in a case where the temperature of the shaping aperture array substrate 28 is increased, as illustrated in FIG. 5B, the illumination region 28a is allowed to be wide.

The mask writing apparatus according to the first embodiment can appropriately control the temperature of the shaping aperture array substrate 28 by changing the opening area of the first opening 22x of the restriction aperture unit 22.

By changing the opening area of the first opening 22x of the restriction aperture unit 22, the dose of the electron beam B to the shaping aperture array substrate 28 can be directly changed. For this reason, the time required for changing the temperature of the shaping aperture array substrate 28 is shortened. Therefore, the throughput of the mask writing apparatus is improved.

It is preferable that the first portion 22a and the second portion 22b of the restriction aperture unit 22 are separated from each other. The first portion 22a and the second portion 22b do not come into contact with each other during the time of relatively moving, and thus, dust emission is suppressed.

It is preferable that the first portion 22a and the second portion 22b of the restriction aperture unit 22 contain a heavy metal. For example, since the first portion 22a and the second portion 22b contain a heavy metal having a higher specific gravity than silicon (Si), generation of X-rays is suppressed. In addition, a desired ability of shielding the electron beam can be obtained. In addition, since the first portion 22a and the second portion 22b contain a heavy metal, heat resistance is improved.

The thickness of the first portion 22a and the second portion 22b of the restriction aperture unit 22 is preferably 0.3 mm or more and 3 mm or less, more preferably 0.5 mm or more and 2 mm or less. In a case where the thickness is larger than the above-mentioned lower limit, a sufficient ability of shielding the electron beam can be obtained. In addition, in a case where the thickness is smaller than the above-mentioned upper limit, the weight is reduced, and the support by the support portion 26 is facilitated.

The maximum opening area of the first opening 22x of the restriction aperture unit 22 is, for example, preferably 1.2 times or more and 3 times or less, more preferably 1.5 times or more and 2.5 times or less of the minimum opening area. In a case where maximum opening area is larger than the above-mentioned lower limit, the temperature of the shaping aperture array substrate 28 can be controlled in a wide temperature range. In addition, in a case where maximum opening area is smaller than the above-mentioned lower limit, the size of the restriction aperture unit 22 can be reduced, and the processing is facilitated.

As described above, the multi charged particle beam writing apparatus according to the first embodiment can quickly and appropriately control the temperature of the shaping aperture array substrate 28 by allowing the opening area of the first opening 22x of the restriction aperture unit 22 to be variable.

Second Embodiment

A multi charged particle beam writing apparatus according to a second embodiment is the same as the multi charged particle beam writing apparatus according to the first embodiment except that the structure of the restriction aperture unit is different from that of the first embodiment. Hereinafter, a portion of contents overlapping with the first embodiment will be omitted in description.

Figure 6A:
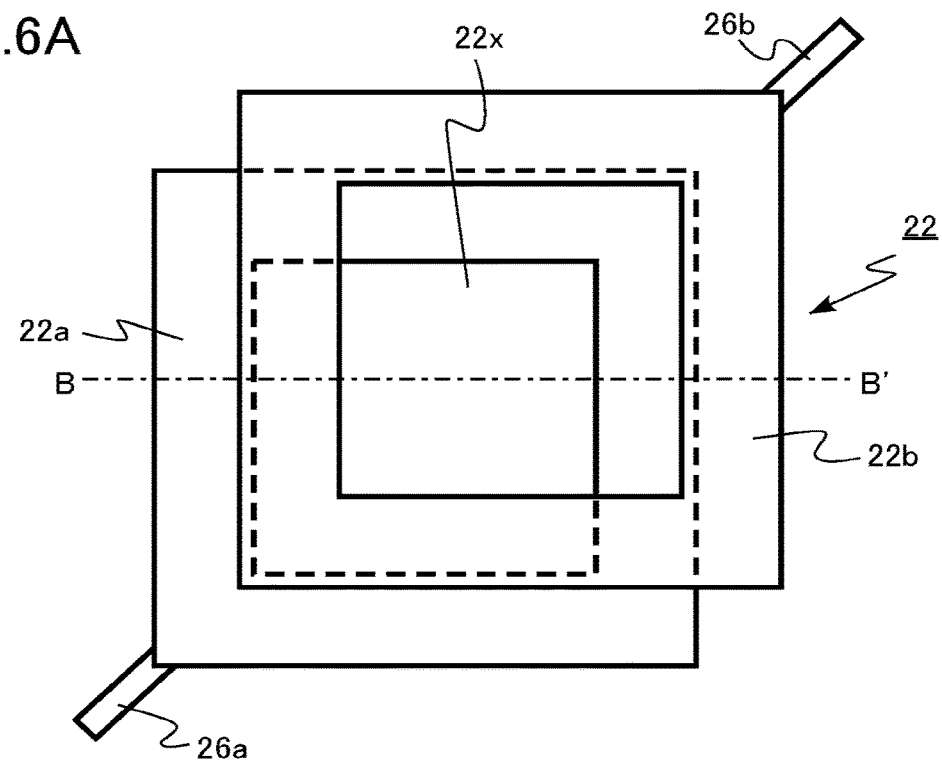
FIGS. 6A, 6B, 6C, and 6D are schematic views of a restriction aperture unit according to a second embodiment.
Figure 6B:
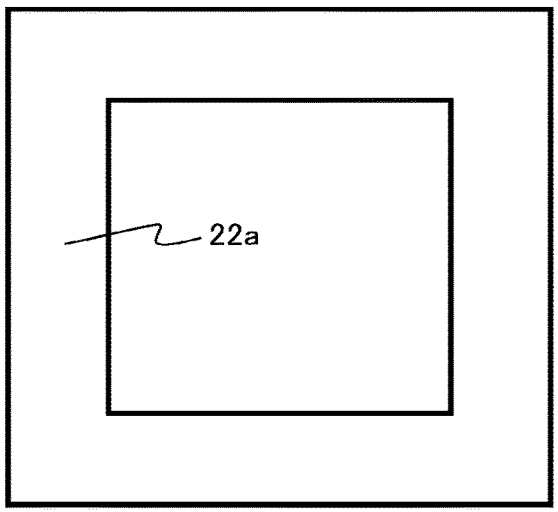
Figure 6C:
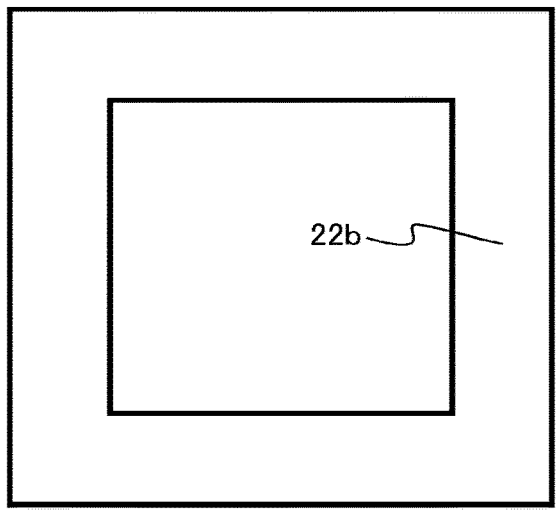
Figure 6D:
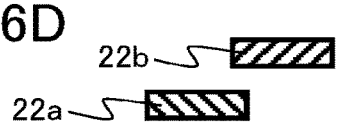
Figure 6D:
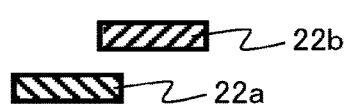

FIGS. 6A, 6B, and 6C are schematic views of the restriction aperture unit according to the second embodiment. FIG. 6A is a top view of a restriction aperture unit, FIG. 6B is a top view of a portion (first portion) of the restriction aperture unit, FIG. 6C is a top view of another portion (second portion) of the restriction aperture unit, and FIG. 6D is a cross-sectional view of the restriction aperture unit. FIG. 6D illustrates a BB' cross-section of FIG. 6A.

As illustrated in FIG. 6A, the restriction aperture unit 22 has a first opening 22x. The first opening 22x has, for example, a rectangular shape. The first opening 22x has, for example, a square shape. A portion of the electron beam B with which the restriction aperture unit 22 is irradiated passes through the first opening 22x.

The restriction aperture unit 22 has a first portion 22a and a second portion 22b. As illustrated in FIG. 6B, the first portion 22a has a frame shape. In addition, the first portion 22a has a plate shape.

Similarly, as illustrated in FIG. 6C, the second portion 22b has a frame shape. In addition, the second portion 22b has a plate shape.

As illustrated in FIGS. 6A and 6D, at least a portion of the second portion 22b faces the first portion 22a. In other words, at least a portion of the second portion 22b overlaps the first portion 22a in the up-down direction. The first opening 22x is formed by the second portion 22b overlapping the first portion 22a.

The first portion 22a and the second portion 22b are separated from each other, for example, in the up-down direction. For example, the first portion 22a and the second portion 22b are not in contact with each other.

For the first portion 22a and the second portion 22b constituting the restriction aperture unit 22, for example, those having the same material and thickness as those in the first embodiment can be used.

Figure 7A:
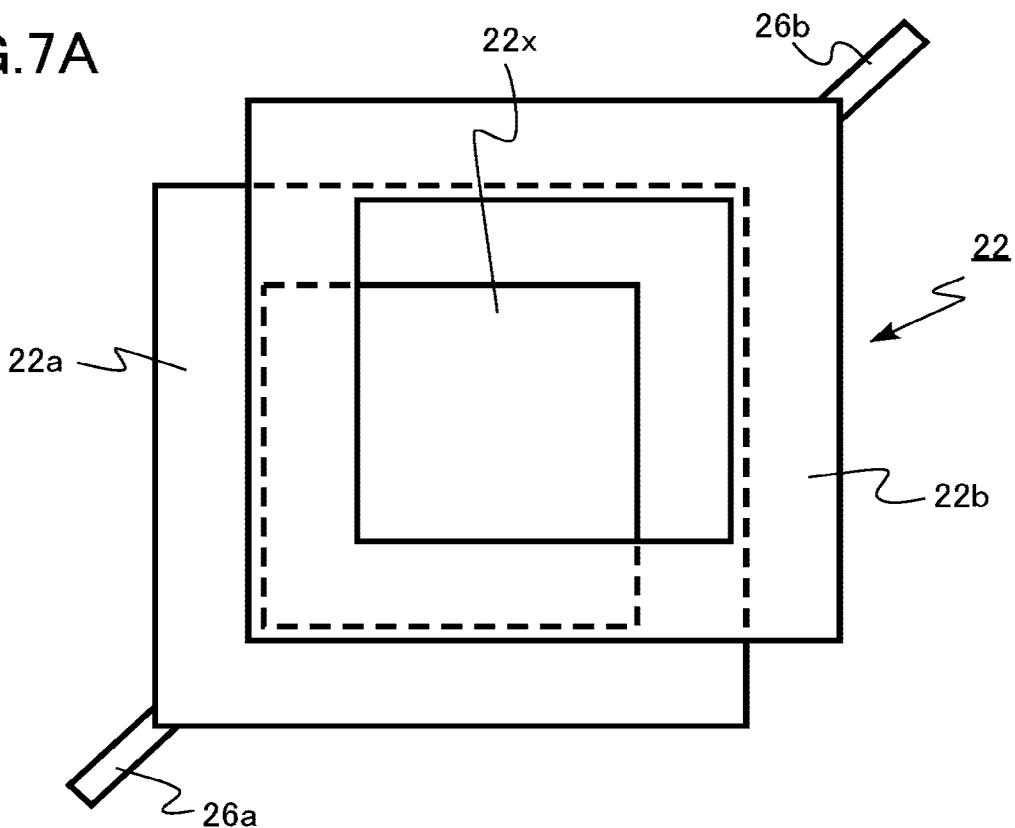
FIGS. 7A and 7B are explanatory views of the restriction aperture unit according to the second embodiment.
Figure 7B:
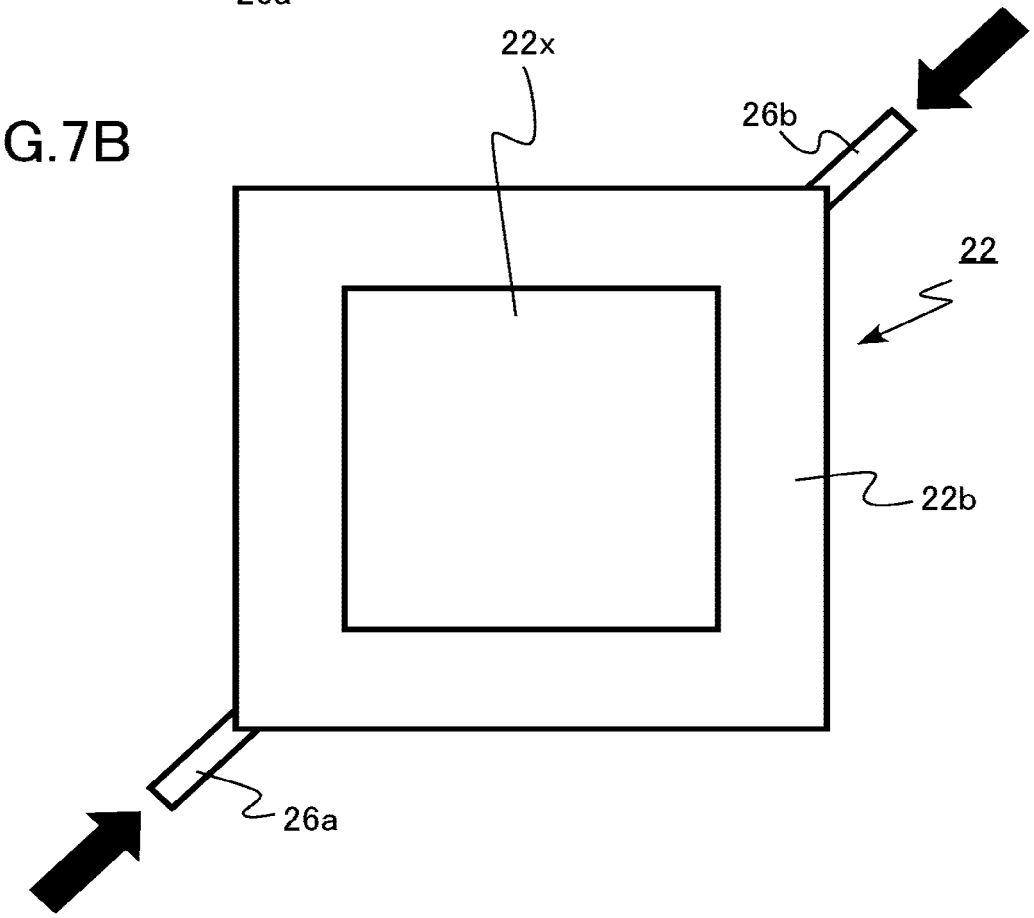

FIGS. 7A and 7B are explanatory views of the restriction aperture unit according to the second embodiment. FIG. 7A illustrates a state where the opening area of the first opening 22x is small, and FIG. 7B illustrates a state where the opening area of the first opening 22x is large.

The opening area of the first opening 22x of the restriction aperture unit 22 is variable. For example, by horizontally moving the support portion 26 in the direction of the arrow by driving the driving motor 24, the opening area can be changed from the state where the opening area illustrated in FIG. 7A is small to the state where the opening area illustrated in FIG. 7B is large. In addition, by horizontally moving the support portion 26 in the direction opposite to the direction of the arrow by driving the driving motor 24, the opening area can be changed from the state where the opening area illustrated in FIG. 7B is large to the state where the opening area illustrated in FIG. 7A is small.

As described above, similarly to the first embodiment, the multi charged particle beam writing apparatus according to the second embodiment can quickly and appropriately control the temperature of the shaping aperture array substrate 28 by allowing the opening area of the first opening 22x of the restriction aperture unit 22 to be variable.

Third Embodiment

A multi charged particle beam writing apparatus according to a third embodiment is the same as the multi charged particle beam writing apparatus according to the first embodiment except that the structure of the restriction aperture unit is different from that of the first embodiment. Hereinafter, a portion of contents overlapping with the first embodiment will be omitted in description.

Figure 8A:
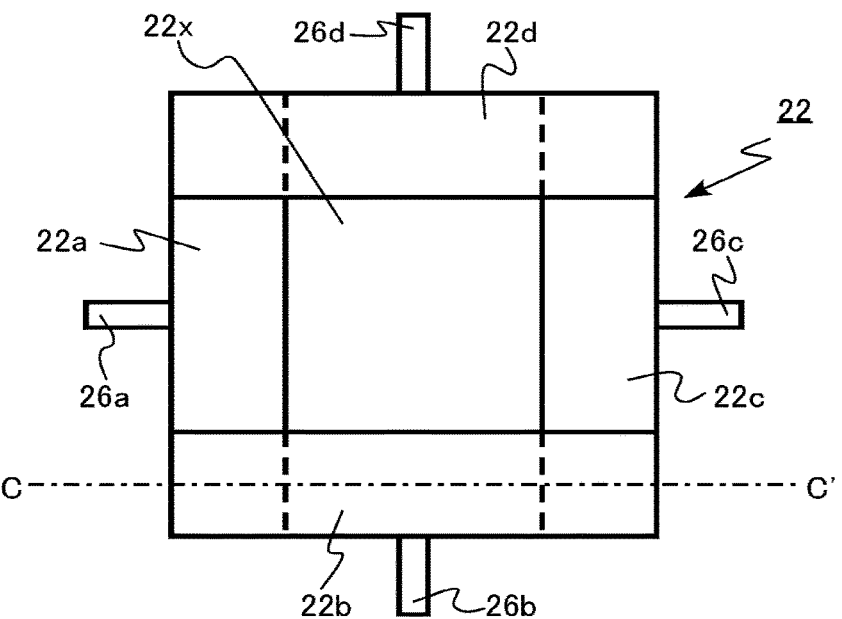
FIGS. 8A, 8B, 8C, and 8D are schematic views of a restriction aperture unit according to a third embodiment.
Figure 8B:
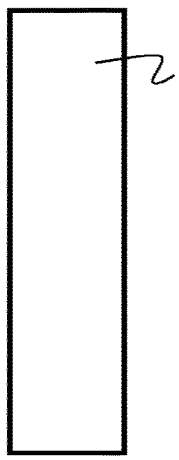
Figure 8B:
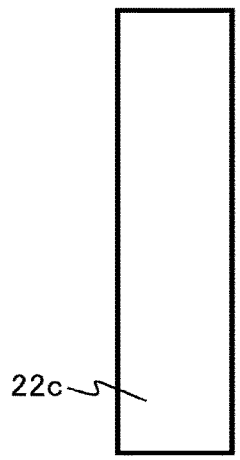
Figure 8C:
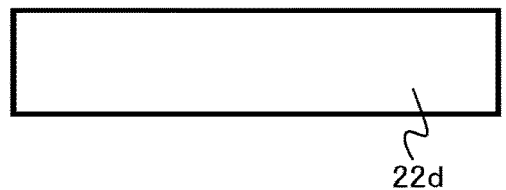
Figure 8C:
Figure 8D:

FIGS. 8A, 8B, 8C, and 8D are schematic views of the restriction aperture unit according to the third embodiment. FIG. 8A is a top view of the restriction aperture unit, FIG. 8B is a top view of a portion (first portion and third portion) of the restriction aperture unit, FIG. 8C is a top view of another portion (second portion and fourth portion) of the restriction aperture unit, and FIG. 8D is a cross-sectional view of the restriction aperture unit. FIG. 8D illustrates CC' cross-section of FIG. 8A.

As illustrated in FIG. 8A, the restriction aperture unit 22 has a first opening 22x. The first opening 22x has, for example, a rectangular shape. The first opening 22x has, for example, a square shape. A portion of the electron beam B with which the restriction aperture unit 22 is irradiated passes through the first opening 22x.

The restriction aperture unit 22 has a first portion 22a, a second portion 22b, a third portion 22c, and a fourth portion 22d. As illustrated in FIG. 8B, the first portion 22a and the third portion 22c have a rectangular shape. In addition, the first portion 22a and the third portion 22c have a plate shape.

Similarly, as illustrated in FIG. 8C, the second portion 22b and the fourth portion 22d have a rectangular shape. In addition, the second portion 22b and the fourth portion 22d have a plate shape.

As illustrated in FIGS. 8A and 8D, at least a portion of the second portion 22b faces the first portion 22a and the third portion 22c. At least a portion of the second portion 22b overlaps the first portion 22a and the third portion 22c in the up-down direction. At least a portion of the fourth portion 22d overlaps the first portion 22a and the third portion 22c in the up-down direction. The first opening 22x is formed by the second portion 22b and the fourth portion 22d overlapping the first portion 22a and the third portion 22c.

The first portion 22a is separated from the second portion 22b and the fourth portion 22d, for example, in the facing direction, that is, in the up-down direction. The third portion 22c is separated from the second portion 22b and the fourth portion 22d, for example, in the facing direction, that is, in the up-down direction.

The first portion 22a is separated from the second portion 22b and the fourth portion 22d and the third portion 22c is separated from the second portion 22b and the fourth portion 22d, for example, respectively, with a predetermined gap in the up-down direction without contact.

For the first portion 22a, the second portion 22b, the third portion 22c, and the fourth portion 22d constituting the restriction aperture unit 22, for example, those having the same material and thickness as those in the first embodiment can be used.

The support portion 26 supports the restriction aperture unit 22. The support portion 26 has a first support bar 26a, a second support bar 26b, a third support bar 26c, and a fourth support bar 26d. For example, the first portion 22a is supported by the first support bar 26a. For example, the second portion 22b is supported by the second support bar 26b. For example, the third portion 22c is supported by the third support bar 26c. For example, the fourth portion 22d is supported by the fourth support bar 26d.

The first portion 22a, the second portion 22b, the third portion 22c, and the fourth portion 22d are supported at one location by the first support bar 26a, the second support bar 26b, and the third support bar 26c, and the fourth support bar 26d, respectively. Each of the first portion 22a, the second portion 22b, the third portion 22c, and the fourth portion 22d may be supported by the support portion 26 at a plurality of locations.

Figure 9A:
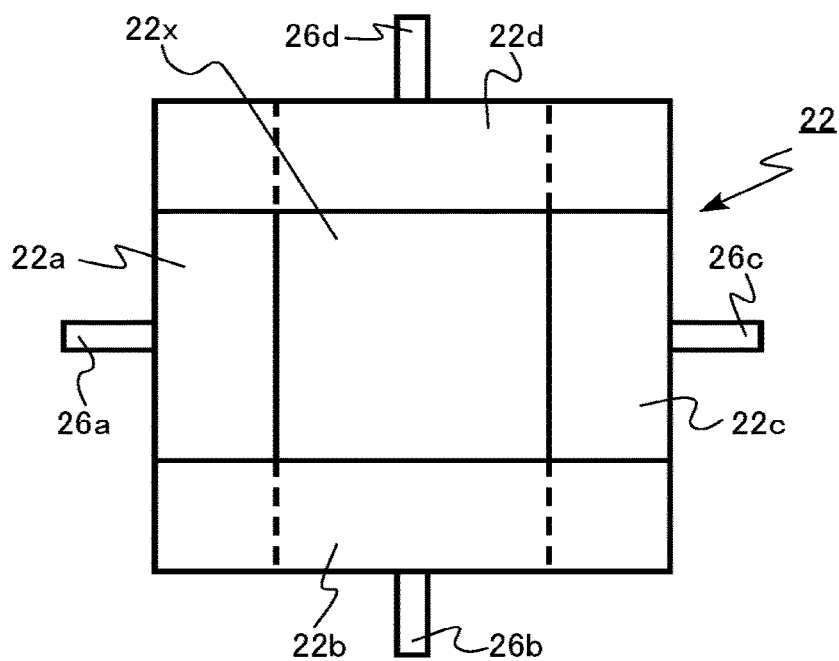
FIGS. 9A and 9B are explanatory views of the restriction aperture unit according to the third embodiment.
Figure 9B:
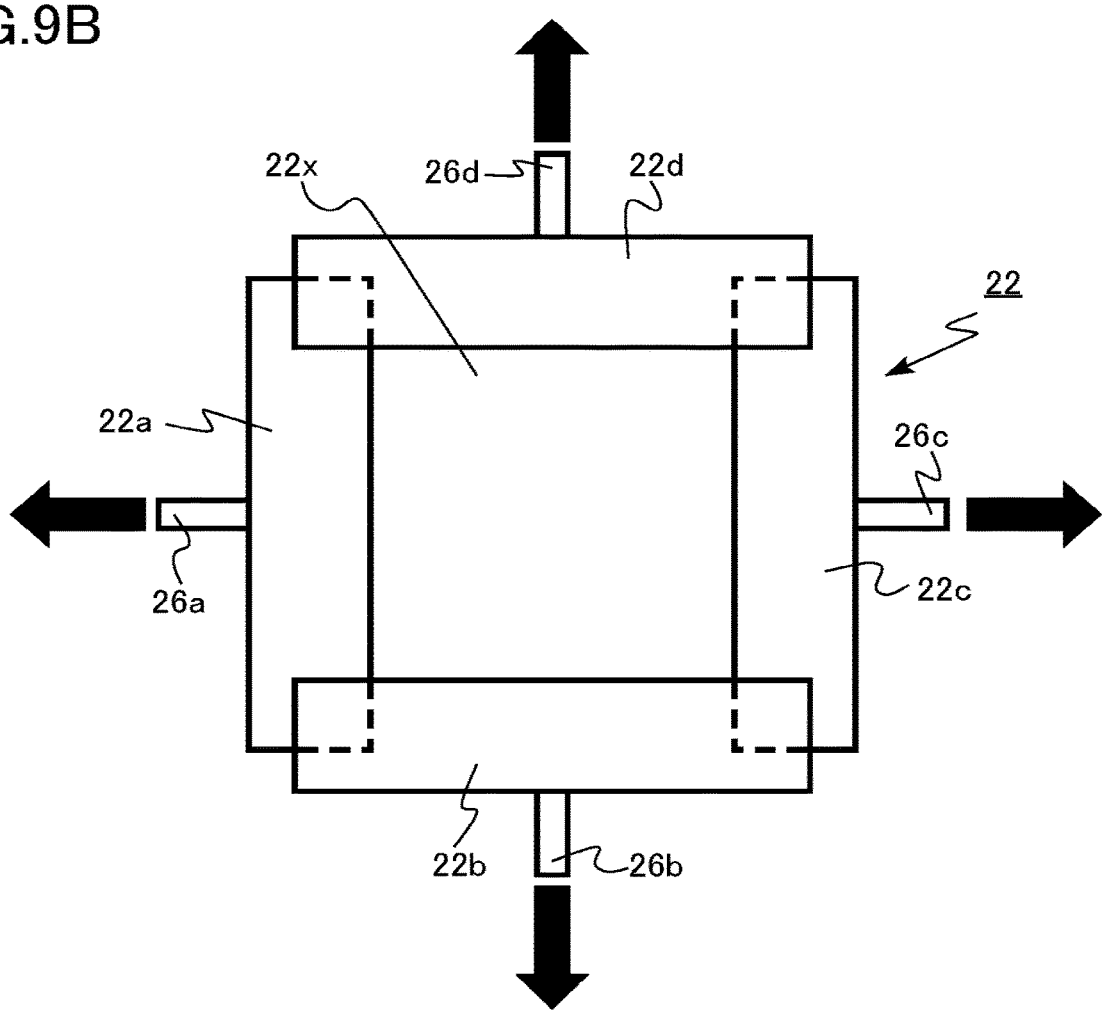

FIGS. 9A and 9B are explanatory views of the restriction aperture unit according to the third embodiment. FIG. 9A illustrates a state in which the opening area of the first opening 22x is small, and FIG. 9B illustrates a state in which the opening area of the first opening 22x is large.

The opening area of the first opening 22x of the restriction aperture unit 22 is variable. For example, by horizontally moving the support portion 26 in the direction of the arrow by driving the driving motor 24, the opening area can be changed from the state where the opening area illustrated in FIG. 9A is small to the state where the opening area illustrated in FIG. 9B is large. In addition, by horizontally moving the support portion 26 in the direction opposite to the direction of the arrow by driving the driving motor 24, the opening area can be changed from the state where the opening area illustrated in FIG. 9B is large to the state where the opening area illustrated in FIG. 9A is small.

As described above, similarly to the first embodiment, the multi charged particle beam writing apparatus according to the third embodiment can quickly and appropriately control the temperature of the shaping aperture array substrate 28 by allowing the opening area of the first opening 22x of the restriction aperture unit 22 to be variable.

Fourth Embodiment

A multi charged particle beam writing apparatus according to a fourth embodiment is different from the multi charged particle beam writing apparatus according to the first embodiment in that the multi charged particle beam writing apparatus according to the fourth embodiment further includes an electrostatic lens. Hereinafter, a portion of contents overlapping with the first embodiment will be omitted in description.

Figure 10:
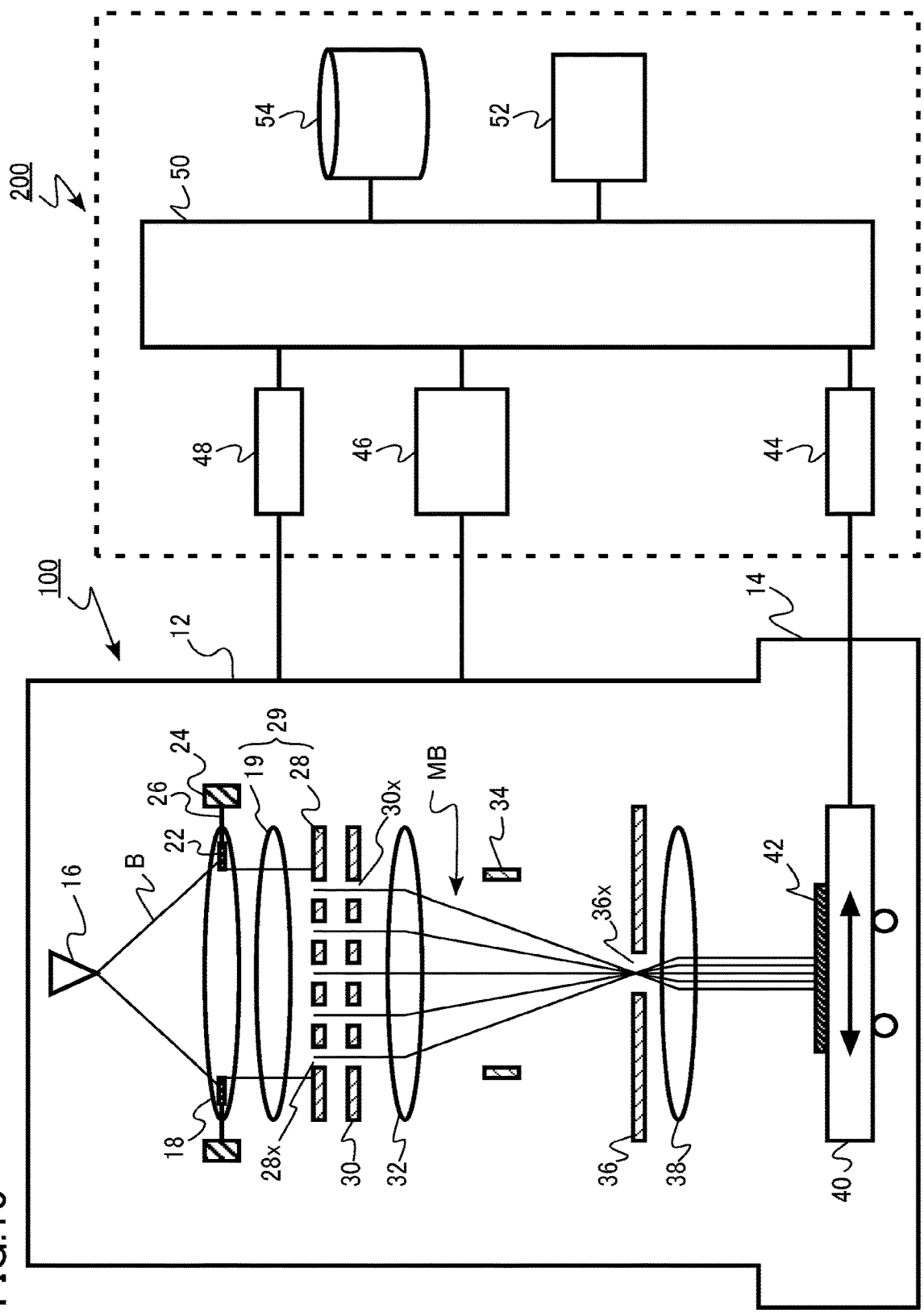
FIG. 10 is a conceptual view illustrating a configuration of a multi charged particle beam writing apparatus according to a fourth embodiment.

FIG. 10 is a conceptual view illustrating a configuration of a multi charged particle beam writing apparatus according to the fourth embodiment. In the fourth embodiment, an electrostatic lens 19 is provided between the illumination lens 18 and the shaping aperture array substrate 28.

The electrostatic lens 19 constitutes a lattice lens 29 using the shaping aperture array substrate 28 as a lattice. The lattice lens 29 reduces the aberration of the illumination system to narrow the size of the light source image on the stopping aperture substrate 36. The electrostatic lens 19 is arranged between the illumination lens 18 and the shaping aperture array substrate 28.

In order not to disturb the electric field of the lattice lens 29, the restriction aperture unit 22 is provided in the illumination lens 18 or on the side closer to the electron gun assembly 16 than to the illumination lens 18. FIG. 10 illustrates a case where the restriction aperture unit 22 is provided in the illumination lens 18.

As described above, similarly to the first embodiment, even in a case where the lattice lens 29 is provided, the multi charged particle beam writing apparatus according to the fourth embodiment can quickly and appropriately control the temperature of the shaping aperture array substrate 28 by allowing the opening area of the first opening 22x of the restriction aperture unit 22 to be variable.

Fifth Embodiment

A multi charged particle beam writing apparatus according to a fifth embodiment is different from the multi charged particle beam writing apparatus of the second embodiment in that the projection lens is omitted and each beam of the multiple beams MB is directed to the opening of the stopping aperture substrate at an angle from the restriction aperture substrate. Hereinafter, a portion of contents overlapping with the first and second embodiments will be omitted in description.

Figure 11:
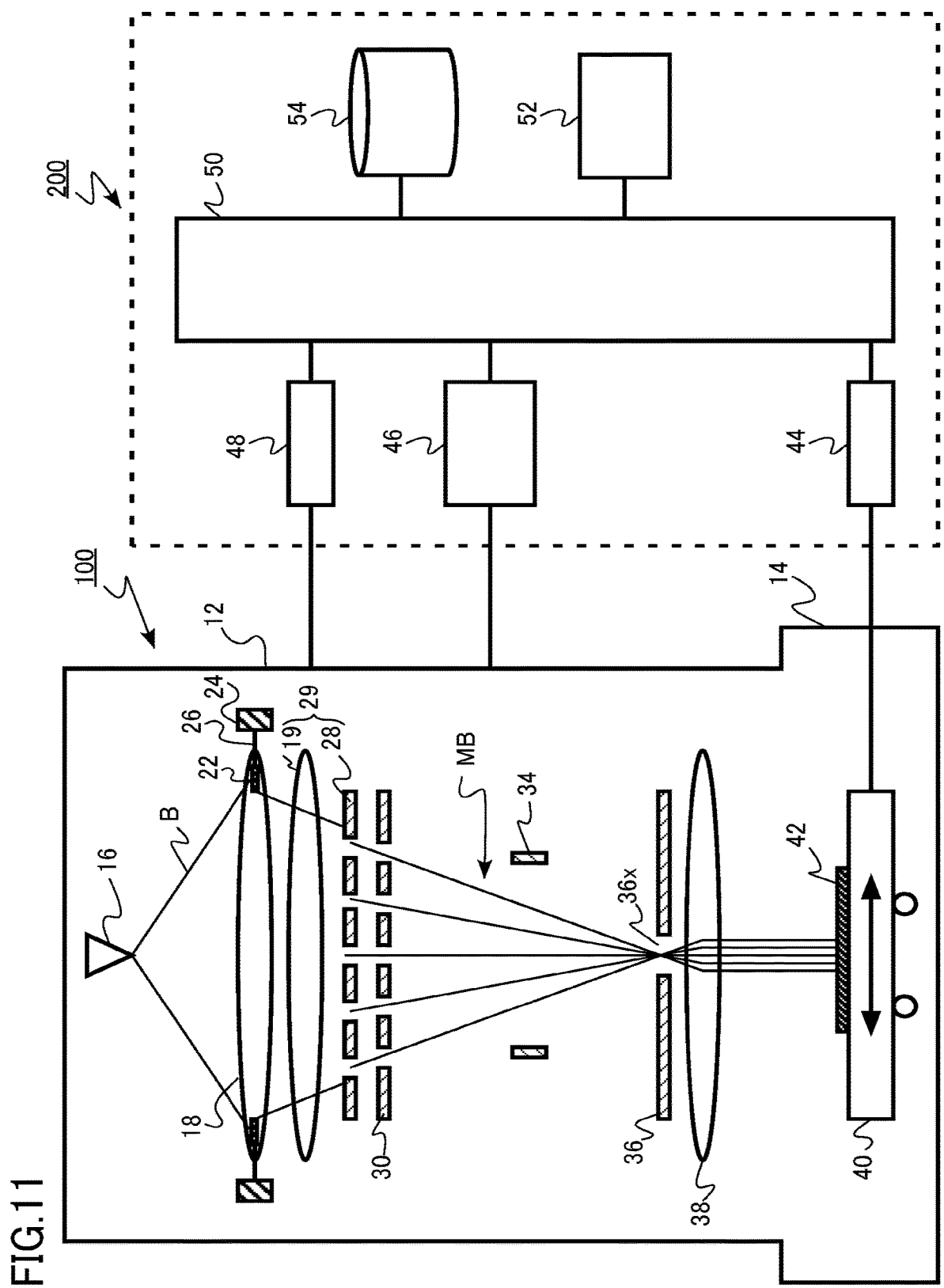
FIG. 11 is a conceptual view illustrating a configuration of a multi charged particle beam writing apparatus according to a fifth embodiment.

FIG. 11 is a conceptual view illustrating a configuration of a multi charged particle beam writing apparatus according to the fifth embodiment. In the fifth embodiment, similarly to the fourth embodiment, the electrostatic lens 19 is provided between the illumination lens 18 and the shaping aperture array substrate 28, but the configuration may be the same as that of the first embodiment.

Herein, as illustrated in FIG. 11, since the reduction optical system is configured with the illumination lens 18, the pitch of the arrangement of the third openings 30x of the blanking aperture array substrate 30 is smaller than the pitch of the arrangement of the second openings 28x of the shaping aperture array substrate 28.

The beam diameter of the electron beam B gradually decreases from the time when the electron beam passes through the restriction aperture unit 22. In addition, the pitch of each beam of the multiple beams MB gradually decreases from the time when the beam passes through the shaping aperture array substrate 28. The multiple beams MB passes through the blanking aperture array substrate 30 with a smaller pitch than the pitch of each beam formed by the shaping aperture array substrate 28.

As described above, similarly to the first embodiment, in a case where the multiple beams MB travel while narrowing the beam pitch, the multi charged particle beam writing apparatus according to the fifth embodiment can quickly and appropriately control the temperature of the shaping aperture array substrate 28 by allowing the opening area of the first opening 22x of the restriction aperture unit 22 to be variable.

The embodiment has been described with reference to the specific examples. However, the embodiment is not limited to these specific examples.

In the first to third embodiments, the case where the shape of the first opening 22x of the restriction aperture unit 22 is rectangular has been described as an example, but the shape of the first opening 22x is not limited to a rectangular shape. The shape of the first opening 22x may be, for example, a pentagon or more polygon or a circle. For example, an iris diaphragm structure using diaphragm blades can be applied to the restriction aperture unit 22.

In the first to fifth embodiments, the case where the charged particle beam writing apparatus is a mask writing apparatus has been described as an example, but the embodiments can be applied to, for example, a charged particle beam writing apparatus that directly draws a pattern on a semiconductor wafer.

In addition, although the portions that are not directly necessary for the description of the embodiment such as the device configuration and the control method are omitted in description, the required device configuration and control method can be appropriately selected and used. For example, although the configuration of the control unit that controls the charged particle beam writing apparatus is omitted in description, it goes without saying that the required configuration of the control unit is appropriately selected and used. In addition, all charged particle beam writing apparatuses and apertures which include the elements of the invention and of which design can be appropriately changed by those skilled in the art are included in the scope of the invention.

What is claimed is:

1. A multi charged particle beam writing apparatus comprising:
    an emission unit emitting a charged particle beam;
    a restriction aperture unit having a first opening having a variable opening area, the restriction aperture unit shielding a portion of the charged particle beam;
    a shaping aperture array substrate having a plurality of second openings, the shaping aperture array substrate forming multiple beams by allowing the shaping aperture array substrate to be irradiated with the charged particle beam passing through the first opening and the shaping aperture array substrate allowing a portion of the charged particle beam to pass through the plurality of second openings; and
    a blanking aperture array substrate having a plurality of third openings, each beam of the multiple beams passing through the plurality of third openings, the blanking aperture array substrate being capable of independently deflecting each beam of the multiple beams.

2. The multi charged particle beam writing apparatus according to claim 1, wherein the first opening of the restriction aperture unit is formed by combining a first portion and a second portion that are relatively movable.

3. The multi charged particle beam writing apparatus according to claim 2, wherein the first portion and the second portion are separated from each other.

4. The multi charged particle beam writing apparatus according to claim 2, wherein the first portion and the second portion have an L-shaped plate shape.

5. The multi charged particle beam writing apparatus according to claim 2, wherein each of the first portion and the second portion have a frame shape and a plate shape.

6. The multi charged particle beam writing apparatus according to claim 2, wherein the thickness of the first portion and the thickness of the second portion are 0.3 mm or more and 3 mm or less.

7. The multi charged particle beam writing apparatus according to claim 2, further comprising a driving motor relatively moving the first portion and the second portion.

8. The multi charged particle beam writing apparatus according to claim 1, wherein the first opening has a rectangular shape.

9. The multi charged particle beam writing apparatus according to claim 1, wherein a maximum opening area of the first opening is 1.2 times or more and 3 times or less of a minimum opening area of the first opening.

10. The multi charged particle beam writing apparatus according to claim 1, wherein the restriction aperture unit contains a heavy metal.

11. The multi charged particle beam writing apparatus according to claim 1, further comprising:
- an illumination lens provided between the emission unit and the restriction aperture unit; and
- a projection lens, the blanking aperture array substrate being located between the projection lens and the illumination lens.

12. The multi charged particle beam writing apparatus according to claim 11, further comprising an electrostatic lens provided between the illumination lens and the shaping aperture array substrate.

\* \* \* \* \*